(12) United States Patent
Hshieh

(10) Patent No.: US 8,389,354 B2
(45) Date of Patent: Mar. 5, 2013

(54) TRENCHED MOSFETS WITH IMPROVED GATE-DRAIN (GD) CLAMP DIODES

(75) Inventor: Fwu-Iuan Hshieh, Saratoga, CA (US)

(73) Assignee: Force-MOS Technology Corporation, British West Indies (KY)

( * ) Notice: Subject to any disclaimer, the term of this patent is extended or adjusted under 35 U.S.C. 154(b) by 856 days.

(21) Appl. No.: 12/383,247

(22) Filed: Mar. 19, 2009

(65) Prior Publication Data

US 2009/0219657 A1 Sep. 3, 2009

Related U.S. Application Data

(62) Division of application No. 11/788,497, filed on Apr. 20, 2007, now Pat. No. 7,511,357.

(51) Int. Cl.
*H01L 21/8234* (2006.01)

(52) U.S. Cl. ................ 438/237; 438/270; 257/E21.356; 257/E21.361

(58) Field of Classification Search .................. 257/603, 257/E21.356, E21.361; 438/237, 270
See application file for complete search history.

(56) References Cited

U.S. PATENT DOCUMENTS

| 5,475,258 | A * | 12/1995 | Kato et al. ..................... 257/603 |
| 5,550,701 | A * | 8/1996 | Nadd et al. ..................... 361/103 |
| 7,902,604 | B2 * | 3/2011 | Su et al. ......................... 257/356 |
| 2010/0200920 | A1 * | 8/2010 | Su et al. ......................... 257/355 |
| 2010/0237414 | A1 * | 9/2010 | Hsieh ............................. 257/337 |
| 2010/0289059 | A1 * | 11/2010 | Hsieh ............................. 257/140 |

\* cited by examiner

*Primary Examiner* — Zandra Smith
*Assistant Examiner* — Toniae Thomas
(74) *Attorney, Agent, or Firm* — Bo-In Lin

(57) ABSTRACT

A method for operating a semiconductor power device by in a forward conducting mode instead of an avalanche mode during a voltage fly-back during an inductive switch operation for absorbing a transient energy with less stress. The method includes a step of clamping the semiconductor power device with a Zener diode connected between a gate metal and a drain metal of the semiconductor power device to function as a gate-drain (GD) clamp diode with the GD clamp diode having an avalanche voltage lower than a source/drain avalanche voltage of the semiconductor power device whereby as the voltage fly-back inducing a drain voltage increase rapidly reaching the avalanche voltage of the GD clamp diode for generating the forward conducting mode.

6 Claims, 14 Drawing Sheets

US 8,389,354 B2

TRENCHED MOSFETS WITH IMPROVED GATE-DRAIN (GD) CLAMP DIODES

This patent application is a Divisional Application and claims the Priority Date of another patent application Ser. No. 11/788,497 filed on Apr. 20, 2007 now U.S. Pat. No. 7,511,357 by the Applicant of this patent application.

BACKGROUND OF THE INVENTION

1. Field of the Invention

This invention relates generally to the cell structure, device configuration and fabrication process of power semiconductor devices. More particularly, this invention relates to a novel and improved cell configuration and processes to manufacture MOSFET device with an improved drain-gate clamping diode for avalanche protection by providing the GD clamp diode with lower avalanche breakdown voltage than the trenched MOSFET.

2. Description of the Related Art

Conventional technologies still have technical difficulties in providing effective avalanche protection for the semiconductor power devices. Several circuit structures by implementing Zener diodes for clamping the gate-source and gate-drain voltage for avalanche protection are disclosed. But these circuits and methods still have their disadvantages and limitations.

In U.S. Pat. No. 5,079,608 a the lateral N+/P Zener diodes disposed between the gate and drain of a planar MOSFET are implemented as voltage clamp diodes for avalanche protection. FIG. 1A is a circuit diagram and FIG. 1B is a side cross sectional view for showing the device implemented with the G-D clamp diodes. The clamp diodes have avalanche voltage lower than that of the drain/source of the MOSFET device. When the drain/source voltage rises above the avalanche voltage of the drain/gate diodes, a current flows through the claim diodes. The current develops a voltage across the gate/source resistor and the voltage serves a function to turn on the MOSFET. The gate/source voltage continues to increase until the MOSFET transmits all of the stored inductive energy. The G-D clamp diodes however are built as part of the floating ring structure and such structure is not suitable of MOSFET device implemented with the field plate in the termination area.

U.S. Pat. No. 5,631,187 discloses a planar MOSFET that includes N+/P polysilicon Zener diodes formed between the gate and drain as the voltage clamp diodes. A shunt resistor is further formed between the gate and source for avalanche protection. FIG. 1C is a circuit diagram and FIG. 1D is a side cross sectional view for showing the device implemented with the G-D clamp diodes with the shunt resistor connected between the gate and the source. The protection circuit as disclosed in this invention however suffers from a high leakage current between the gate and source due to the resistor shunt connected between the gate and the source of the MOSFET.

Therefore, there is still a need in the art of the semiconductor device fabrication, particularly for trenched power semiconductor design and fabrication, to provide a novel cell structure, device configuration and fabrication process that would resolve these difficulties and design limitations. Specifically, it is desirable to provide effective over-voltage protection to reduce a likelihood of device damages caused by avalanche. In the meantime, it is also desirable to eliminate the problems and limitations as that encountered in the conventional protection circuits. Additionally, it is desirable to overcome the problems caused by the weak spot due to the presence of a thin oxide layer disposed underneath the Zener diode.

SUMMARY OF THE PRESENT INVENTION

It is therefore an aspect of the present invention to provide new and improved semiconductor power device configuration and manufacture processes for avalanche protection by implementing Zener diodes as GD and GS protection circuits. The Zener diodes are integrated with the trenched semiconductor power device and are insulated from the doped region of the semiconductor power device to prevent a channeling effect. The GD clamp diodes have a lower avalanche breakdown voltage then the trenched semiconductor power device. The GS clamp diodes are also provided that has a lower breakdown voltage then the gate oxide rupture voltage for gate oxide ESD protection. The GD and GS Zener diodes are formed as back-to-back doped polysilicon regions integrated with the semiconductor power device for direct connecting to source, drain and gate metals formed as patterned metal layer above an insulation protective layer on top of the semiconductor power device. For the purpose of contact enhancement, contact trenches are formed and filled with Ti/TiN/W contact plugs for connecting to the Zener diodes and also to the source region, the body region, the drain region, and the gate.

Briefly, in a preferred embodiment, the present invention discloses a MOSFET device that includes a first Zener diode connected between a gate metal and a drain metal of said semiconductor power device for functioning as a gate-drain (GD) clamp diode. The GD clamp diode includes multiple back-to-back doped regions in a polysilicon layer doped with dopant ions of a first conductivity type next to a second conductivity type disposed on an insulation layer above the MOSFET device, having an avalanche voltage lower than a source/drain avalanche voltage of the MOSFET device wherein the Zener diode is insulated from a doped region of the MOSFET device for preventing a channeling effect. The MOSFET device further includes a second Zener diode connected between a gate metal and a source metal of the MOSFET device for functioning as a gate-source (GS) clamp diode, wherein the GD clamp diode includes multiple back-to-back doped regions in the polysilicon layer doped with dopant ions of a first conductivity type next to a second conductivity type disposed on the insulation layer above the MOSFET device having a lower breakdown voltage than a gate oxide rupture voltage of the MOSFET device. The MOSFET device further includes a gate-connection doped region in the polysilicon layer disposed between and connected to the GD clap diode and the GS diode wherein the gate-connection doped region further connected to the gate metal. In an exemplary embodiment, the MOSFET device includes a N-channel metal oxide semiconductor field effect transistor (MOSFET) device and the GD clamp diode and the GS claim diode includes multiple back-to-back doped regions with a polysilicon layer doped with N+ dopant ions next to a P dopant ions disposed on an insulation layer above the MOSFET device. In another exemplary embodiment, the MOSFET device further includes an preservation layer having a thickness substantially greater than five hundred (500) Angstroms for supporting and insulating the GD clamp diode and the GS clamp diode from the semiconductor power device. In another exemplary embodiment, the MOSFET device further includes a gate-connection doped region in said polysilicon layer disposed between and connected to said GD clap diode and said GS diode comprising a N+ doped region in said polysilicon layer for connecting to said gate metal.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
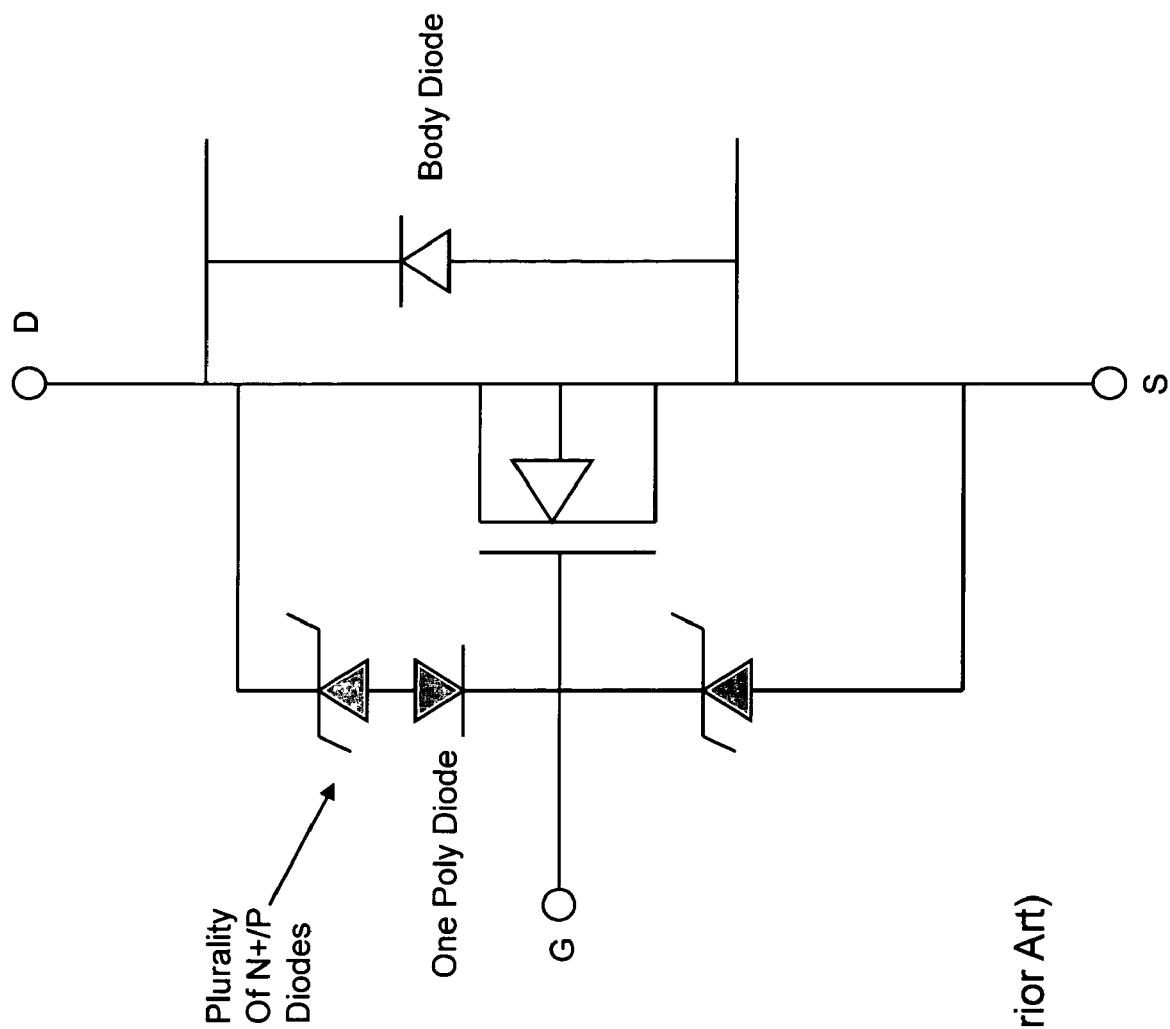
FIGS. 1A and 1B are respectively a circuit diagram and a side cross sectional view of a conventional MOSFET device with drain-gate clamp diode formed for avalanche protection.
Figure 1B:
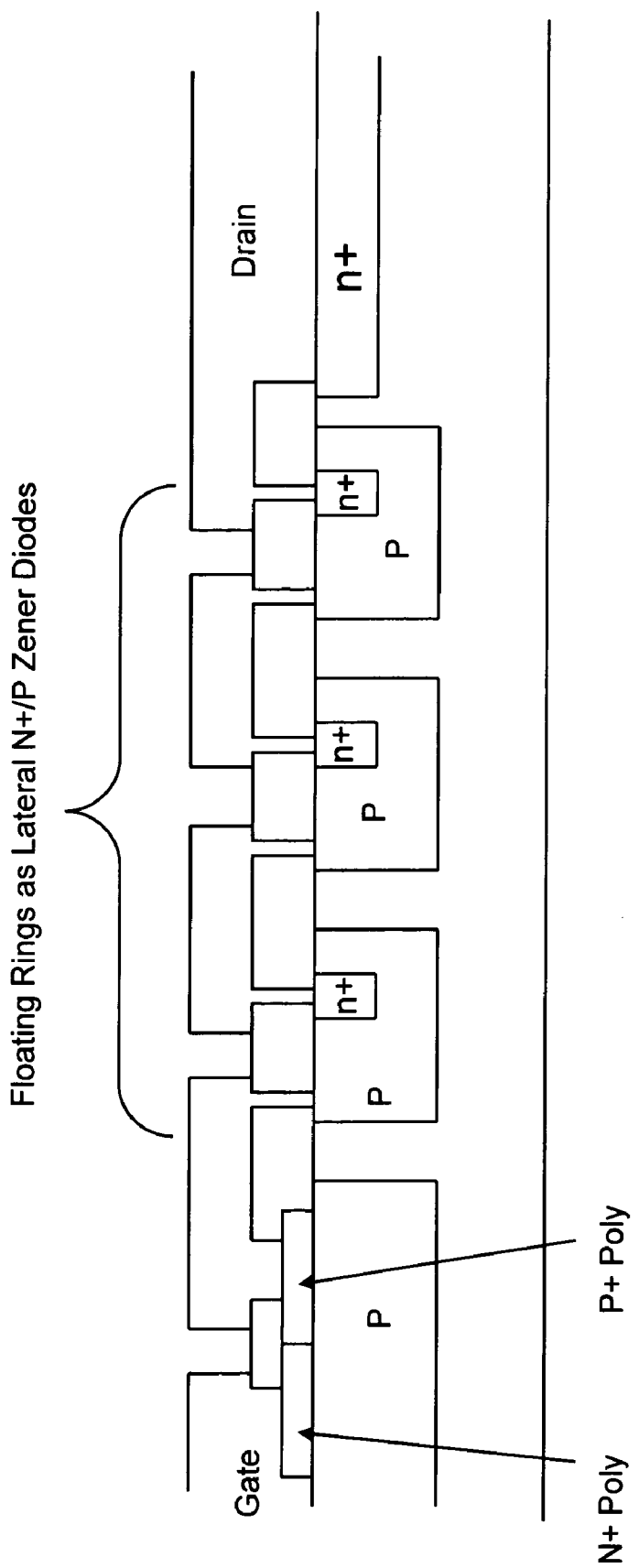
Figure 1C:
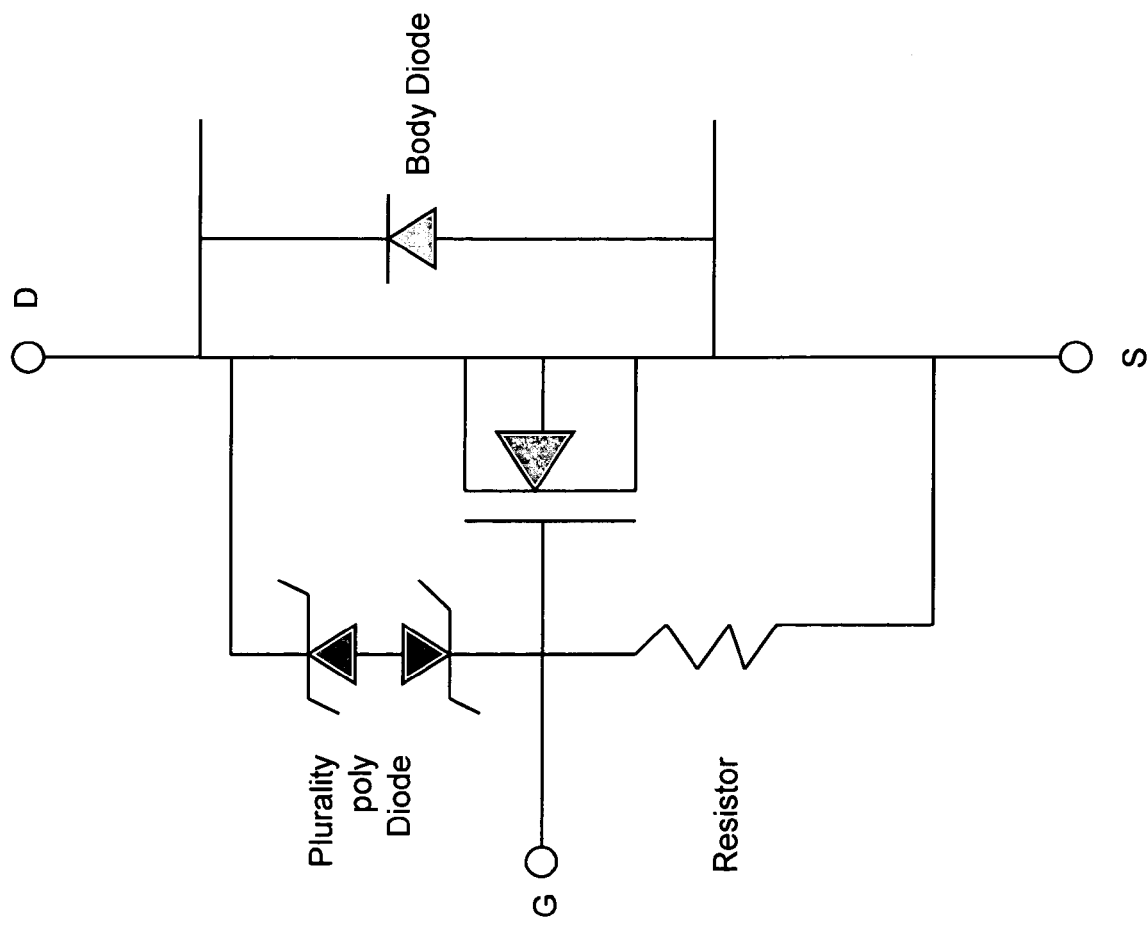
FIGS. 1C and 1D are respectively a circuit diagram and a side cross sectional view of another conventional MOSFET device with drain-gate clamp Zener diodes formed for avalanche protection.
Figure 1D:
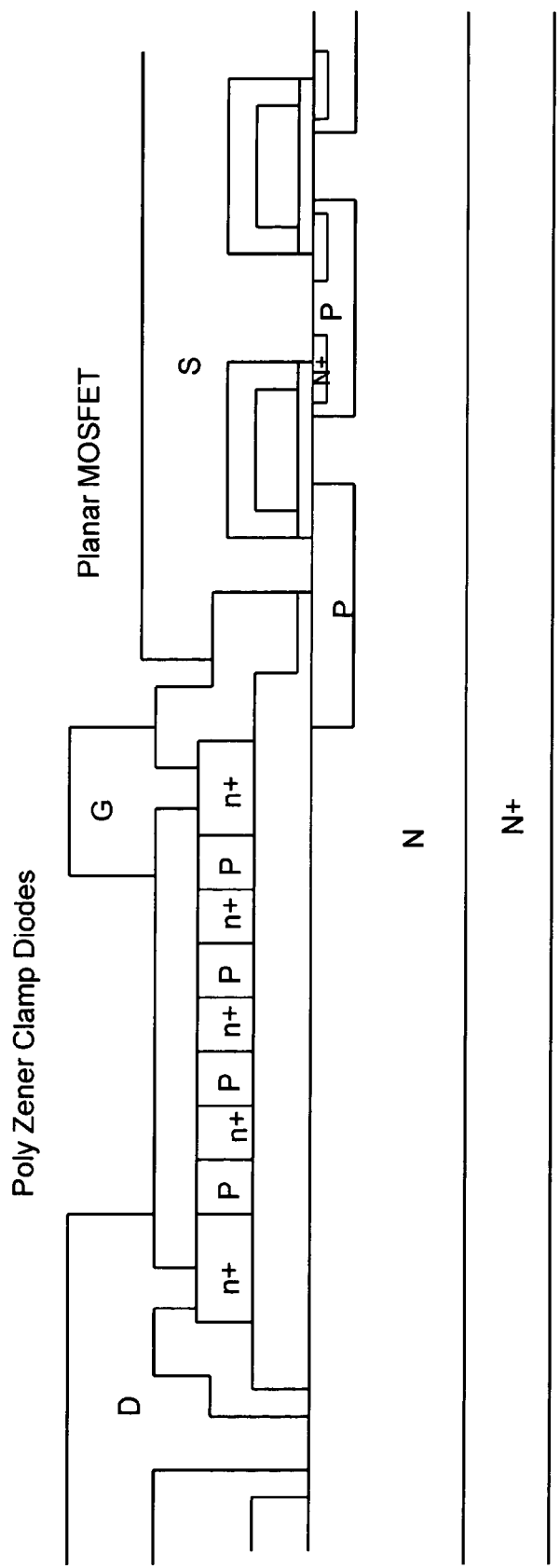
Figure 2A:
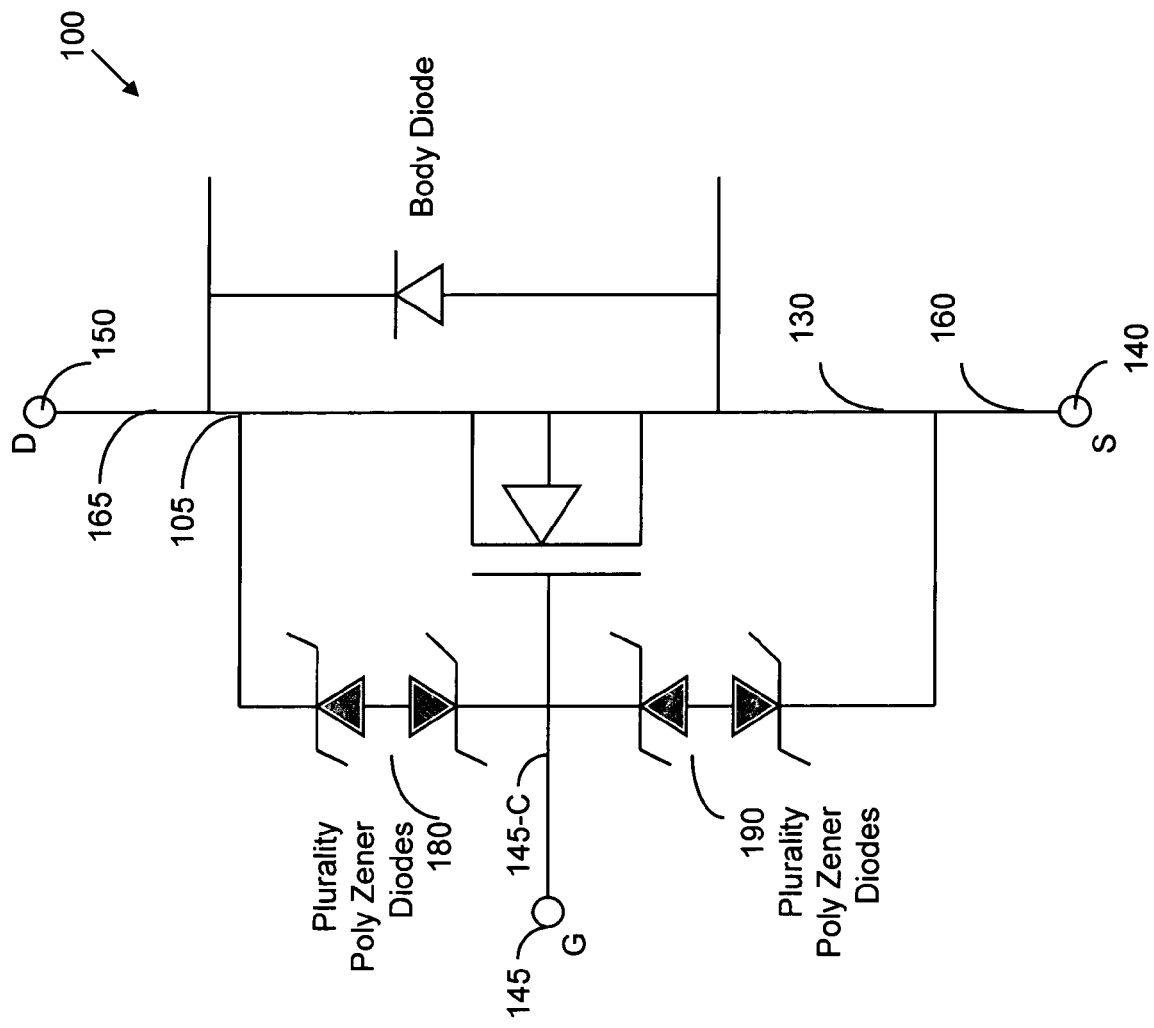
FIGS. 2A and 2B are respective a circuit diagram and a side cross sectional view of an improved MOSFET device with Zener diodes formed in a polysilicon layer to function as GD and GS clamp diodes for avalanche protection.
Figure 2B:
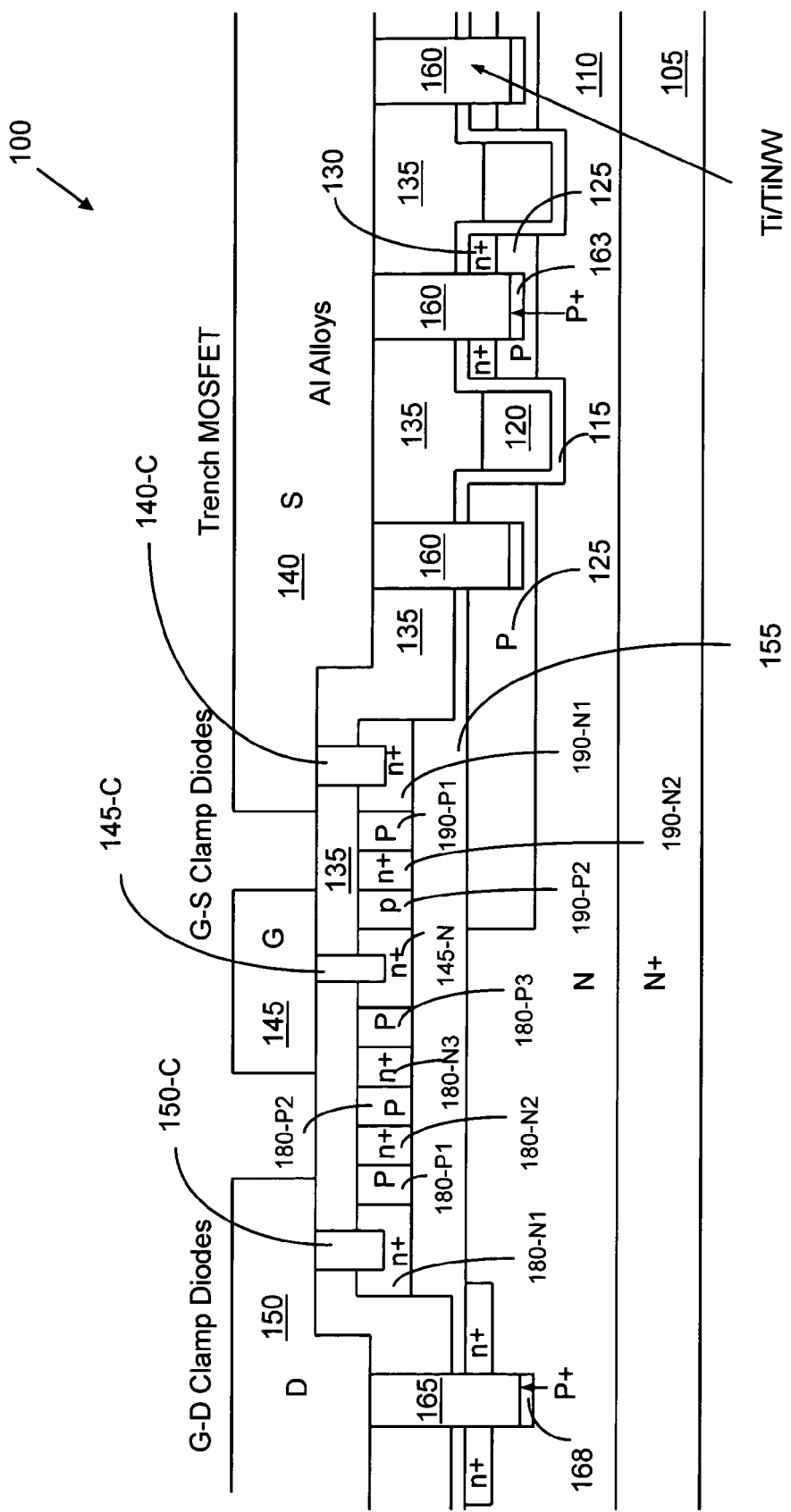

Please refer to FIGS. 2A to 2B for a circuit diagram and a side cross sectional view respectively of a first preferred embodiment of this invention. FIGS. 2A and 2B show a trenched metal oxide semiconductor field effect transistor (MOSFET) device 100 implemented with gate-drain polysilicon Zener clamp diodes 180 and gate-source polysilicon Zener clamp diodes 190 for gate-drain (GD) and gate-source (GS) protections. The trenched MOSFET 100 is supported on a substrate 105 formed with an epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG protective layers 135. A metal layer is formed on top of the insulation protective layer 135 and patterned into a source metal 145, a gate metal 145 and a drain metal 150. Trenches are opened through the protective layer 135 and filled with tungsten plug surrounded by Ti/TiN barrier layers (Ti/TiN/W) contact plug are formed as the source-body trenched contacts 160, the drain trenched contact 165 and gate trenched contact (not specifically shown) with the doped contact regions 163 and 168 formed below the trench bottom in the epitaxial layer 110 for the source/body trenched contact 160 and the drain trenched contact 165 respectively to improve the electrical contact to the source/body and the drain regions respectively.

In order to provide the gate-drain (GD) polysilicon Zener clamp diodes 180 and gate-source (GS) polysilicon Zener clamp diodes 190, polysilicon layer are formed on a thick oxide layer 155 disposed on the top surface of the substrate and doped as alternating N+ and P regions adjacent to each other. The doped polysilicon regions 180-N1, 180-P1, 180-N2, 180-P2, 180-N3, and 180-N3 constitute the GD polysilicon Zener clamp diodes 180 and the doped regions 190-N1, 190-P1, 190-N2, and 190-P2 constitute the GS polysilicon Zener clamp diodes 190. The polysilicon layer further includes a N+ doped region 145-N disposed between the clamp diodes 180 and 190. Electrical contacts to the source metal 140, the gate metal 145 and the drain metal 150 through trenches filled with Ti/TiN/W contact plug as source clamp diode contact 140-C, 145-C and 150-C.

The clamp diodes 180 have avalanche voltage lower than that of the drain/source of the MOSFET device. One of the most important device parameters of trench MOSFET for motor application is so-called inductive switching energy. During the operation of the MOSFET, a voltage pulse is applied to the gate of the trench MOSFET to turn it on and ramp the current through inductor L to a preset value, and then return to ground potential. The energy stored in the inductor forces the drain voltage of the trench MOSFET to rise rapidly to the avalanche voltage of the drain-gate clamp diodes, which is well below the avalanche voltage of the trench MOSFET. The current through the inductor flows from drain to gate electrode of the trench MOSFET through the clamp diodes and external gate resistor rather than through the trench MOSFET itself. This results in an increase of the gate voltage and thus turning on the trench MOSFET when the gate voltage exceeds the threshold voltage. As the result, the clamped trench MOSFET operates in a forward conduction mode rather than the avalanche mode during the voltage flyback and absorbs the transient energy in a much less stressful manner. Because of the integrated drain-gate clamp diodes, the trench MOSFET is able to sustain a considerable amount of energy in the motor application. The clamp diode between gate/source that has avalanche voltage that is lower than a gate oxide rupture voltage, providing gate oxide protection for ESD (electrical static discharge).

Figure 3A:
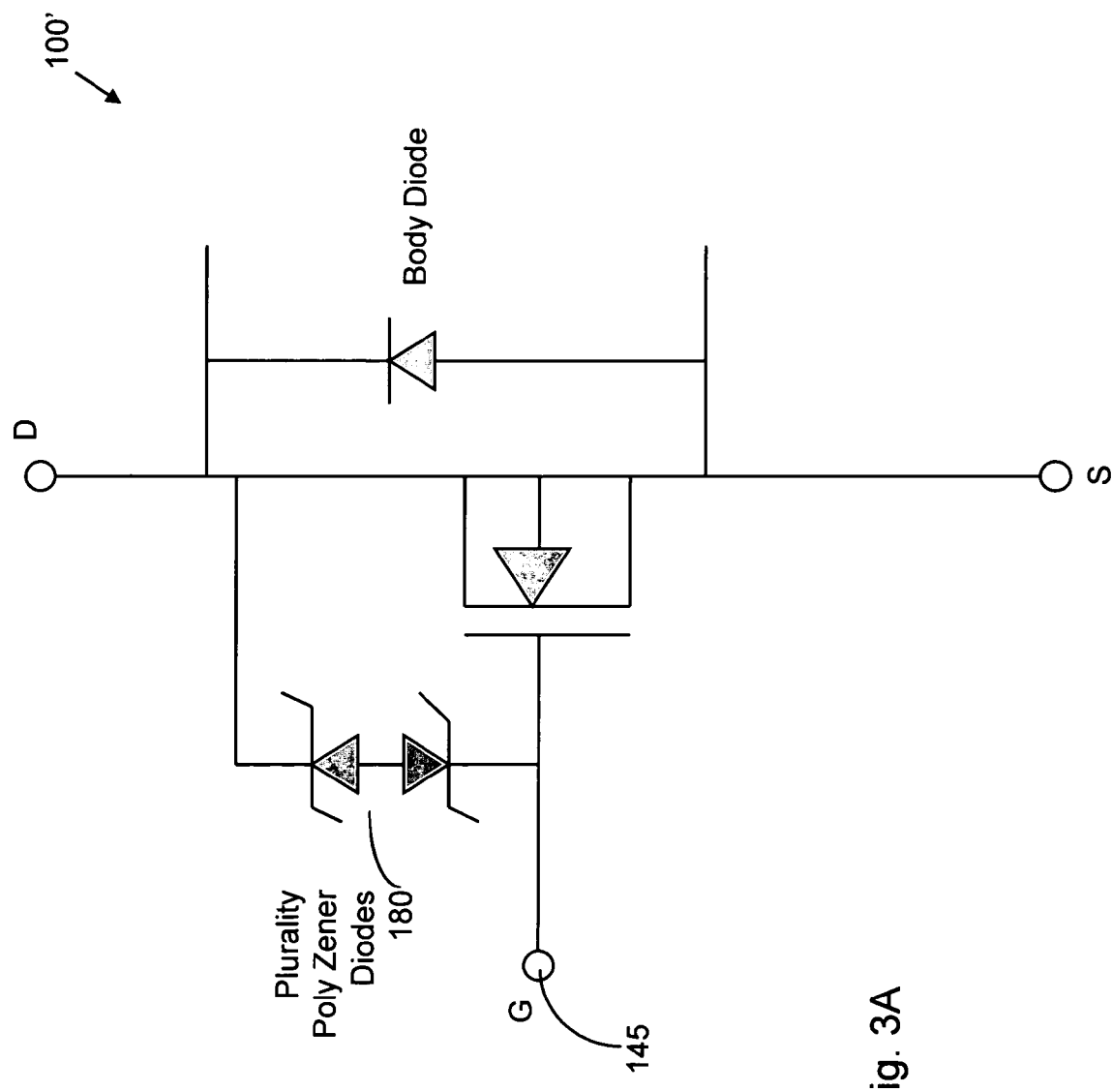
FIGS. 3A and 3B are respective a circuit diagram and a side cross sectional view of an improved MOSFET device with Zener diodes formed in a polysilicon layer to function as GD clamp diodes for avalanche protection.
Figure 3B:
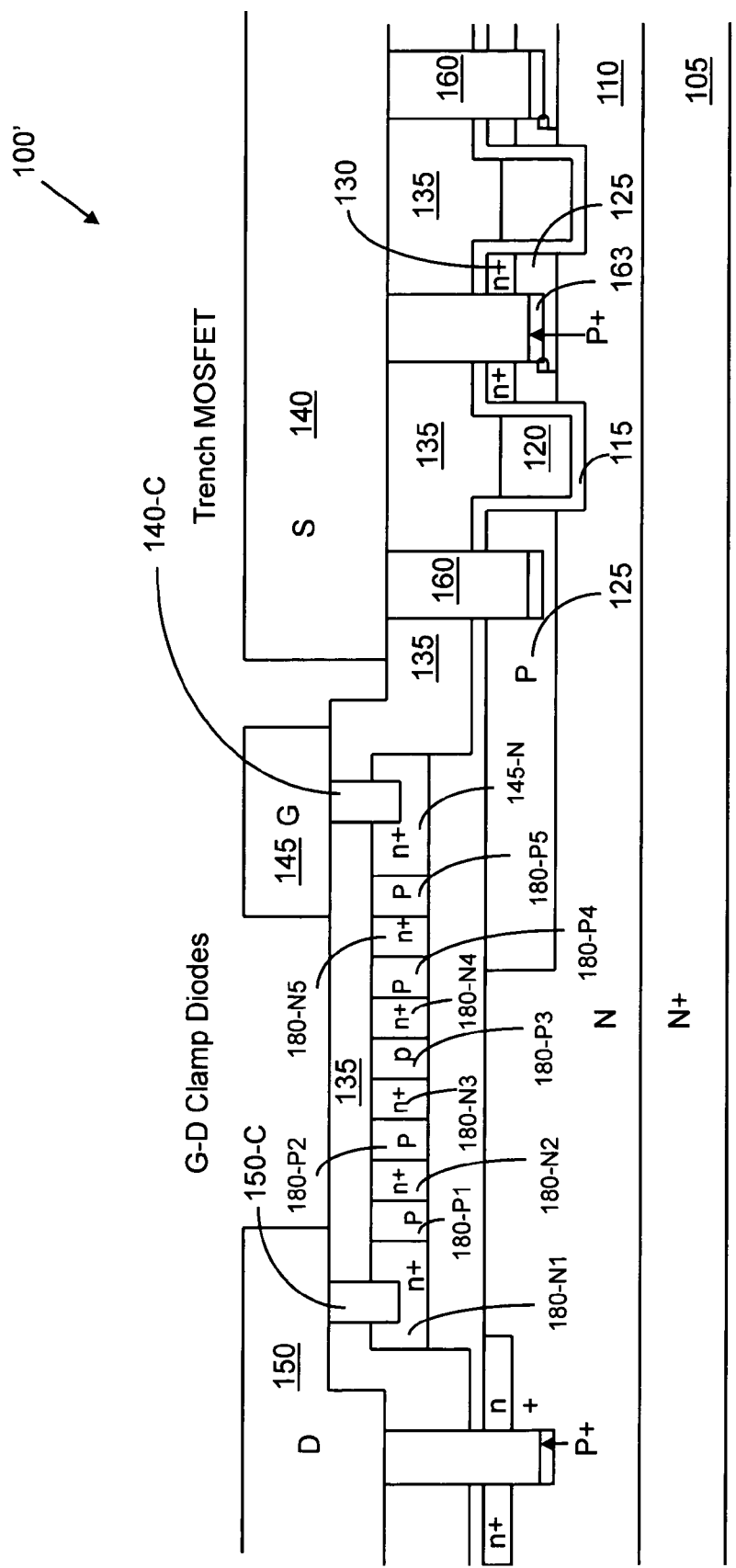

FIGS. 3A to 3B are a circuit diagram and a side cross sectional view respectively of another embodiment similar to the embodiment shown in FIGS. 2A and 2B as described above. FIGS. 3A and 3B show an alternate trenched metal oxide semiconductor field effect transistor (MOSFET) device 100' implemented with gate-drain polysilicon Zener clamp diodes 180 for gate-drain (GD) protections. Similar to the MOSFET 100, the trenched MOSFET 100' is supported on a substrate 105 formed with an epitaxial layer 110. The MOSFET device 100' includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG protective layers 135. A metal layer is formed on top of the insulation protective layer 135 and patterned into a source metal 145, a gate metal 145 and a drain metal 150. Trenches are opened through the protective layer 135 and filled with tungsten plug surrounded by Ti/TiN barrier layers (Ti/TiN/W) contact plug are formed as the source-body trenched contacts 160, the drain trenched contact 165 and gate trenched contact (not specifically shown) with the doped contact regions 163 and 168 formed below the trench bottom in the epitaxial layer 110 for the source/body trenched contact 160 and the drain trenched contact 165 respectively to improve the electrical contact to the source/body and the drain regions respectively.

In order to provide the gate-drain (GD) polysilicon Zener clamp diodes 180, polysilicon layer are formed on a thick oxide layer 155 disposed on the top surface of the substrate and doped as alternating N+ and P regions adjacent to each other. The doped polysilicon regions 180-N1, 180-P1, 180-N2, 180-P2, to 180-N5, and 180-N5 constitute the GD polysilicon Zener clamp diodes 180. The polysilicon layer further includes a N+ doped region 145-N disposed immediately next to the clamp diodes 180. Electrical contacts of the GD polysilicon Zener clamp diodes 180 to the drain metal 150 and the gate metal 145 are through trenches filled with Ti/TiN/W contact plug as source clamp diode contact 150-C, 145-C respectively.

Figure 4A:
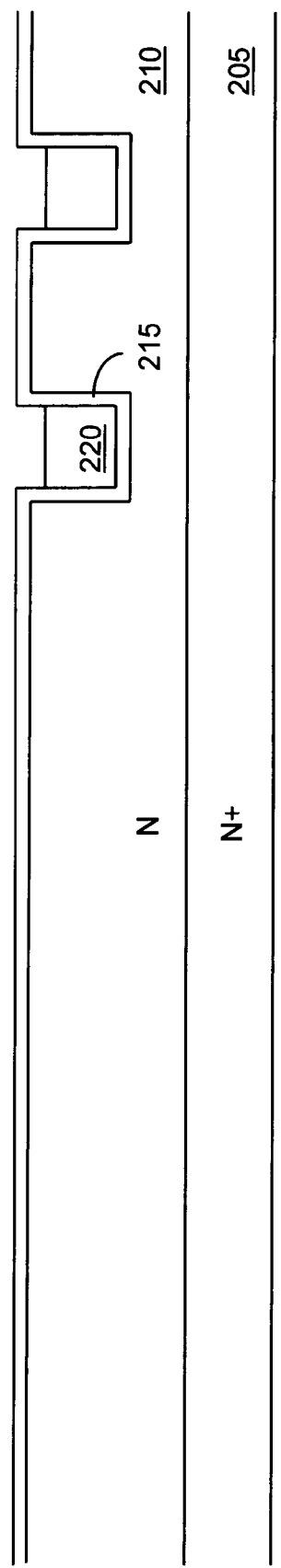
FIGS. 4A to 4F are a serial of side cross sectional views for showing the processing steps for fabricating a MOSFET device as shown in FIGS. 2A and 2B.
Figure 4B:
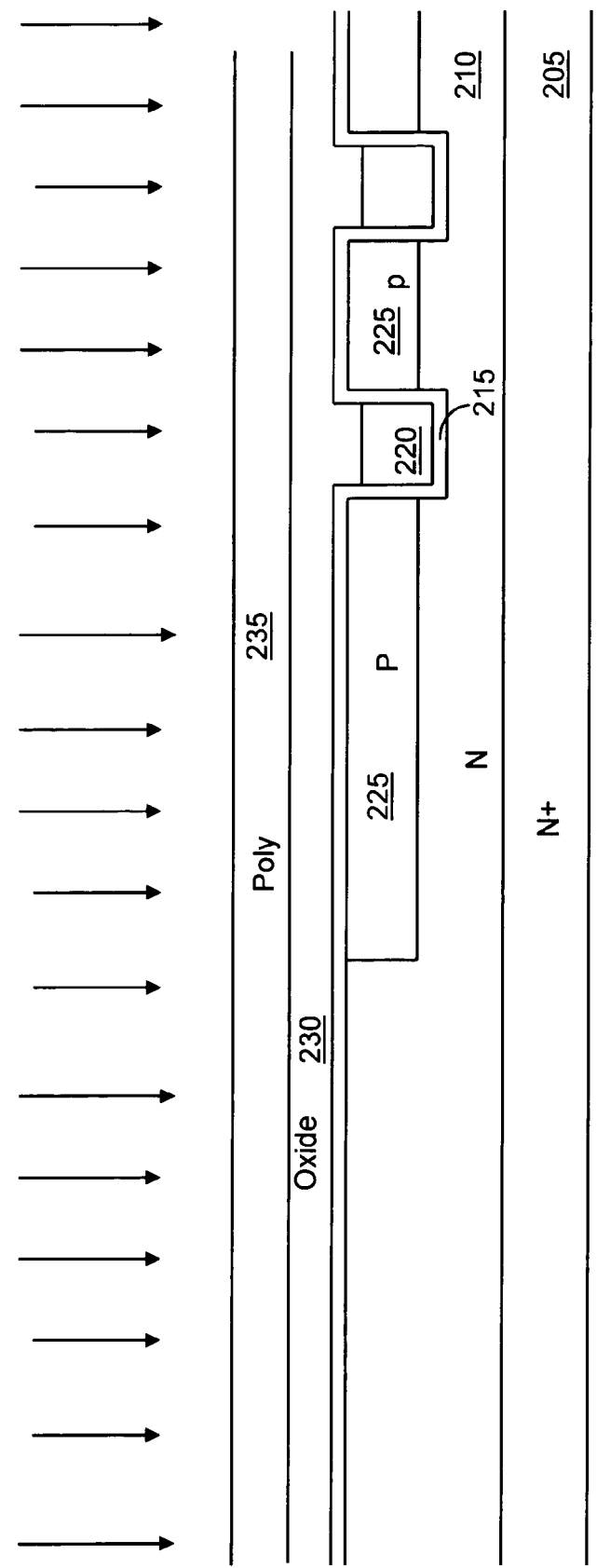

Referring to FIGS. 4A to 4F for a serial of side cross sectional views to illustrate the fabrication steps of a MOSFET device as that shown in FIGS. 2A and 2B. In FIG. 4A, a trench mask (not shown) is applied to open a plurality of trenches in an epitaxial layer 210 supported on a substrate 205 by employing a dry silicon etch process. An oxidation process is then performed to form an oxide layer covering the trench walls. The trench is oxidized with a sacrificial oxide to remove the plasma damaged silicon layer during the process of opening the trench. Then an oxide layer 215 is grown followed by depositing a polysilicon layer 220 to fill the trench and covering the top surface and then doped with an N+ dopant. The polysilicon layer 220 filling the trenches are either etched back or removed by applying a chemical mechanical planarization process (CMP) to remove the polysilicon above the top surface. In FIG. 4B, the manufacturing process proceeds by applying a body mask (not shown) with a P-body implant with a P-type dopant. Then an elevated temperature is applied to diffuse the P-body 225 into the epitaxial layer 210. An oxide deposition is then carried out to form a thick oxide layer 230 followed by a step of depositing an undoped polysilicon layer 235 followed by implanting a P-type ion, e.g., boron ions, as a blank implant into the polysilicon layer 235. The thickness of the thick oxide layer 230 is preferably greater than one thousand Angstroms.

Figure 4C:
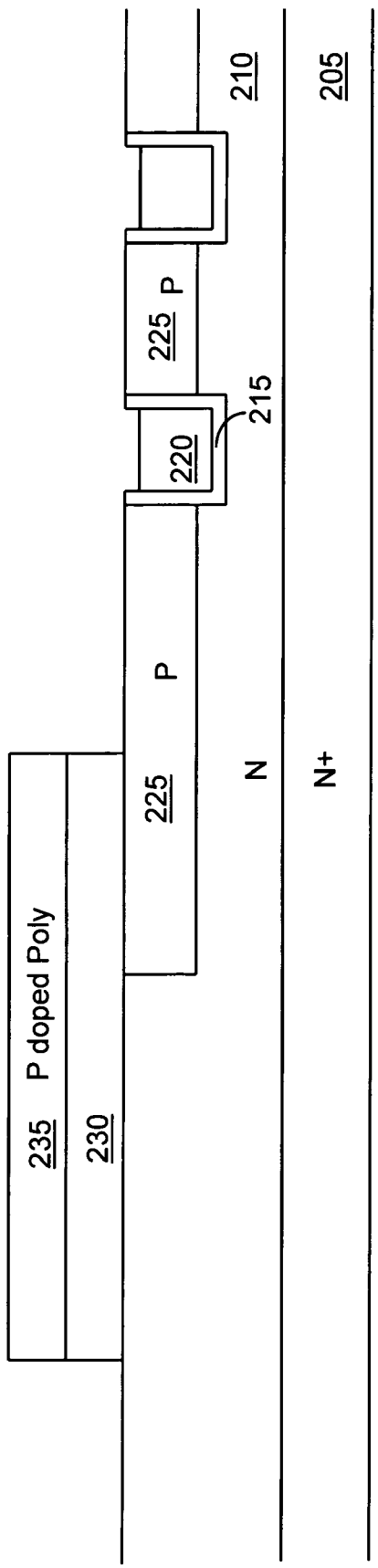
Figure 4D:
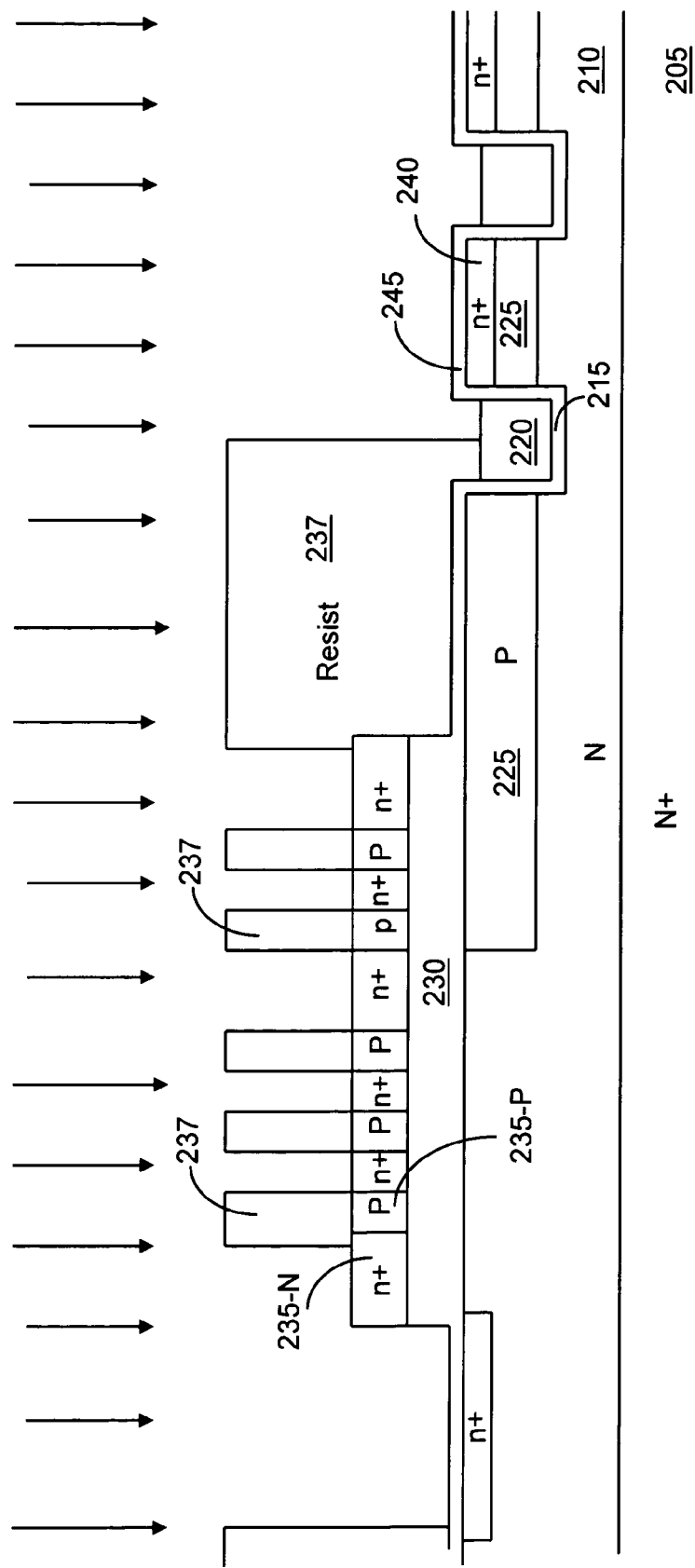
Figure 4E:
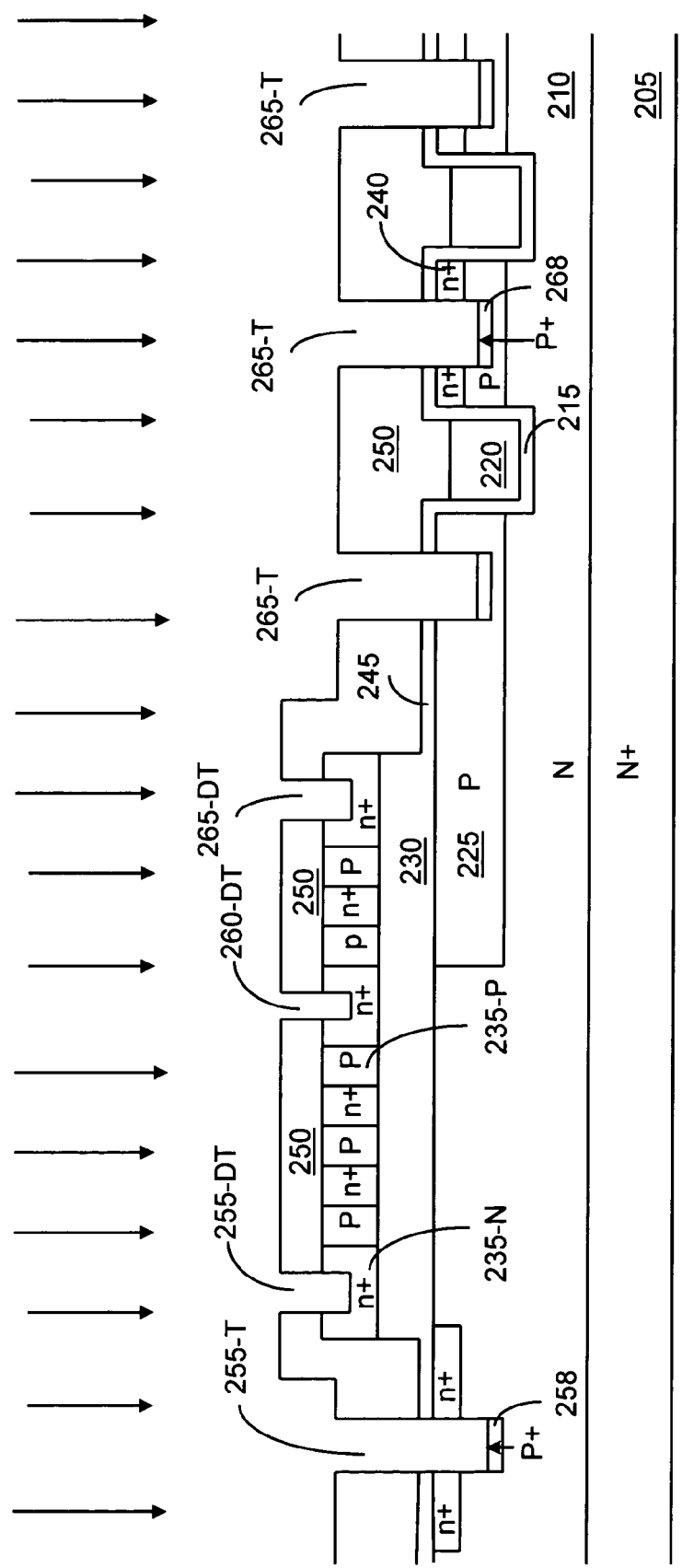
Figure 4F:
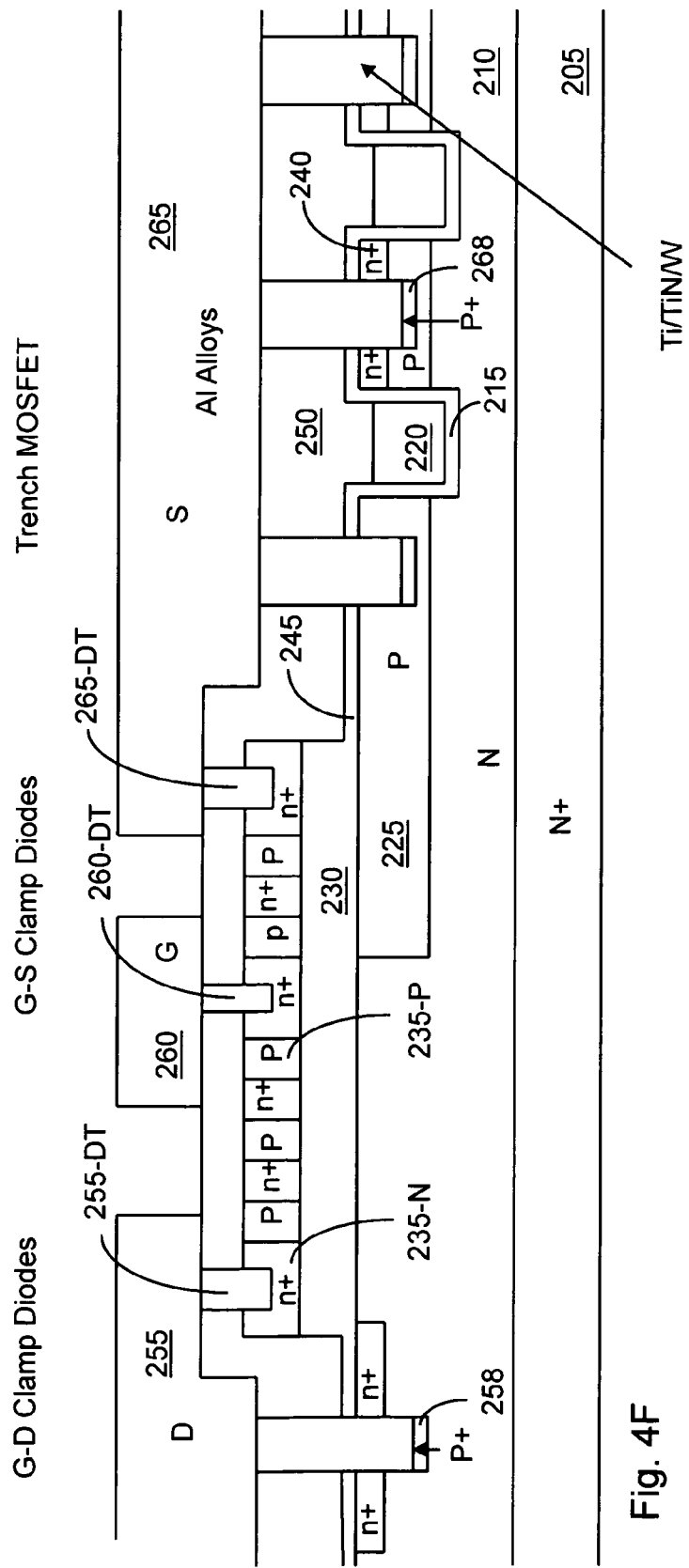

In FIG. 4C, a photo resist (not shown) is applied as a polysilicon mask to carry out a polysilicon etch followed by a dry oxide etching process to etch the thick oxide layer 230. Referring FIG. 4D, the photoresist is first removed followed by a screen growth of an oxide layer 245. A source mask 237 is applied to carry out a source ion implantation to form the source regions 240 and several N+ regions 235-N adjacent to the p-doped regions 235-P thus forming the Zener diodes. In FIG. 4E, the source mask 237 is removed and a BPSG insulation layer 250 is formed over the top. A contact mask (not shown) is applied for first applying a dry oxide etch to open the diode-drain contact trenches 255-DT, the diode-gate contact trenches 260-DT and the diode-source contact trenches 265-DT. A dry silicon etch is applied to complete the drain contact trenches 255-T and the source/body contact trenches 255-T. A boron implant is carried out to form the doped contact regions 258 and 268 under the trench bottom of the drain contact trenches 255-T, the gate contact trenches (not shown) and the source body contact trenches 265-T. In FIG. 4F, the contact trenches 255-DT, 260-DT, 265-DT, 255-T and 265-T are deposited with Ti/TiN/W as contact plugs followed by etching back the contact plugs. A metal layer composed of an aluminum alloy 270 is deposited on top followed by applying a metal mask (not shown) to pattern the metal layer into the drain metal 255, the gate metal 260 and the source metal contact 265. Thus the polysilicon GD and GS clamp diodes are formed as shown in FIG. 4F and also in FIG. 2B.

According to the above drawings and descriptions, this invention further discloses a method for operating a semiconductor power device by in a forward conducting mode instead of an avalanche mode during a voltage fly-back during an inductive switch operation for absorbing a transient energy with less stress. The method includes a step of clamping the semiconductor power device with a Zener diode connected between a gate metal and a drain metal of the semiconductor power device to function as a gate-drain (GD) clamp diode with the GD clamp diode having an avalanche voltage lower than a source/drain avalanche voltage of the semiconductor power device whereby as the voltage fly-back inducing a drain voltage increase rapidly reaching the avalanche voltage of the GD clamp diode for generating the forward conducting mode. In an exemplary embodiment, the method further includes a step of insulating the GD clamp diode from the semiconductor power device for preventing a channeling effect. In another exemplary embodiment, the method further includes a step of clamping the semiconductor power device with a second Zener diode connected between a gate metal and a source metal of the semiconductor power device to function as a gate-source (GS) clamp diode with the GS clamp diode having an avalanche voltage lower than a gate oxide rupture voltage for providing an electrostatic discharge (ESD) gate oxide protection. In another exemplary embodiment, the method further includes a step of forming the GD clamp diode as multiple back-to-back doped regions in a polysilicon layer doped with dopant ions of a first conductivity type next to a second conductivity type disposed on an insulation layer above the semiconductor power device. In another exemplary embodiment, the method further includes a step of forming the GS clamp diode as multiple back-to-back doped regions in a polysilicon layer doped with dopant ions of a first conductivity type next to a second conductivity type disposed on an insulation layer above the semiconductor power device. In another exemplary embodiment, the step of insulating the GD clamp diode from the semiconductor power device further includes a step of forming an insulation layer having a thickness substantially greater than five hundred (500) Angstroms for supporting and insulating the GD clamp diode from the semiconductor power device.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for operating a semiconductor power device during a voltage fly-back in an inductive switch operation in a forward conducting mode instead of an avalanche mode for absorbing a transient energy with less stress, wherein the method further comprising:

clamping said semiconductor power device with a Zener diode connected between a gate metal and a drain metal of said semiconductor power device to function as a gate-drain (GD) clamp diode with said GD clamp diode having an avalanche voltage lower than a source/drain avalanche voltage of said semiconductor power device; and forming said GD clamp diode as the Zener diode connected to the gate through a gate metal pad on top of a top surface and further having a doped region of said Zener diode contacting directly to a body region of the semiconductor power device.

2. The method of claim 1 further comprising a step of:

insulating said GD clamp diode and a drain electrode on the top surface of the semiconductor substrate of said GD clamp diode from said semiconductor power device for preventing a channeling effect.

3. The method of claim 2 wherein:

said step of insulating said GD clamp diode from said semiconductor power device further comprising a step of forming an insulation layer having a thickness substantially greater than five hundred (500) Angstroms for supporting and insulating said GD clamp diode from said semiconductor power device.

4. The method of claim 1 further comprising:

forming said GD clamp diode as multiple back-to-back doped regions in a polysilicon layer doped with dopant ions of a first conductivity type next to a second conductivity type disposed on an insulation layer above said semiconductor power device with the doped region of said Zener diode as one of the back-to-back doped regions contacting directly to a body region of the semiconductor power device.

5. A method for operating a semiconductor power device during a voltage fly-back in an inductive switch operation in a forward conducting mode instead of an avalanche mode for absorbing a transient energy with less stress, wherein the method further comprising:

clamping said semiconductor power device with a Zener diode connected between a gate metal and a drain metal of said semiconductor power device to function as a gate-drain (GD) clamp diode with said GD clamp diode having an avalanche voltage lower than a source/drain avalanche voltage of said semiconductor power device; and clamping said semiconductor power device with a second Zener diode connected between a gate metal and a source metal of said semiconductor power device to function as a gate-source (GS) clamp diode with said GS clamp diode having an avalanche voltage lower than a gate oxide rupture voltage for providing an electrostatic discharge (ESD) gate oxide protection.

6. The method of claim 5 further comprising:

forming said GS clamp diode as multiple back-to-back doped regions in a polysilicon layer doped with dopant ions of a first conductivity type next to a second conductivity type disposed on an insulation layer above said semiconductor power device.

* * * * *